United States Patent
Seo

(10) Patent No.: US 10,110,211 B1
(45) Date of Patent: Oct. 23, 2018

(54) SEMICONDUCTOR INTEGRATED CIRCUIT

(71) Applicant: SK hynix Inc., Icheon-si, Gyeonggi-do (KR)

(72) Inventor: Jin Cheol Seo, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/871,752

(22) Filed: Jan. 15, 2018

(30) Foreign Application Priority Data

Apr. 17, 2017 (KR) ........................ 10-2017-0049155

(51) Int. Cl.
*G11C 7/22* (2006.01)
*H03K 5/14* (2014.01)
*H03K 5/06* (2006.01)

(52) U.S. Cl.
CPC .............. *H03K 5/14* (2013.01); *G11C 7/222* (2013.01); *H03K 5/06* (2013.01)

(58) Field of Classification Search
CPC . H03K 5/14; H03K 5/06; G11C 7/222; G11C 7/22; G11C 7/10; G11C 7/106; G11C 8/18
USPC .. 327/182, 291, 63, 68, 299, 65, 67, 77, 81, 327/85, 87, 89, 560, 563, 294, 379; 365/189.05, 189.07, 193, 174, 194, 233.1
See application file for complete search history.

(56) References Cited

U.S. PATENT DOCUMENTS

| | | | | |
|---|---|---|---|---|
| 8,456,924 | B2* | 6/2013 | Song | G11C 7/1006 365/189.05 |
| 9,236,101 | B2* | 1/2016 | Lee | G11C 7/222 |
| 2009/0161455 | A1* | 6/2009 | Ku | G11C 7/1072 365/193 |
| 2009/0185413 | A1* | 7/2009 | Kim | G11C 5/143 365/174 |
| 2015/0294701 | A1* | 10/2015 | Park | G11C 7/22 365/189.05 |
| 2018/0137901 | A1* | 5/2018 | Jung | G11C 7/222 |

FOREIGN PATENT DOCUMENTS

KR  1020120050420 A  5/2012

* cited by examiner

*Primary Examiner* — Thomas Skibinski
(74) *Attorney, Agent, or Firm* — William Park & Associates Ltd.

(57) ABSTRACT

A synchronous circuit may be provided. The synchronous circuit may include a first buffer configured to receive an input signal and control the transition timing of an output signal based on a control code. The synchronous circuit may include a delay circuit configured to control a delay time based on the control code to constantly maintain a time that the input signal received by the first buffer arrives at a synchronizing circuit.

20 Claims, 4 Drawing Sheets

SEMICONDUCTOR INTEGRATED CIRCUIT

CROSS-REFERENCES TO RELATED APPLICATION

The present application claims priority under 35 U.S.C. § 119(a) to Korean application number 10-2017-0049155, filed on Apr. 17, 2017, in the Korean Intellectual Property Office, which is incorporated herein by reference in its entirety.

BACKGROUND

1. Technical Field

Various embodiments generally relate to a semiconductor integrated circuit, more particularly to a synchronous circuit.

2. Related Art

A semiconductor integrated circuit may transmit and receive a signal synchronized with a clock.

A voltage level of the signal may be synchronized with a rising edge or a falling edge of the clock to increase a transmission speeds and reception speeds.

When the signal is transmitted between the semiconductor integrated circuits, characteristics of the signal may be changed in accordance with mount environments of the semiconductor integrated circuit such as a signal line length, an external temperature, or an external voltage, etc.

The characteristic changes of the signal may cause an abnormal transmission of the signal.

SUMMARY

In an embodiment, a synchronous circuit may include a first buffer, a delay control circuit, a delay circuit, a second buffer and a synchronizing circuit. The first buffer may be configured to generate a buffering signal based on an input signal, a reference voltage and a control code. The delay control circuit may be configured to generate a delay code based on the control code. The delay circuit may be configured to generate a delay signal based on the delay code and the buffering signal. The second buffer may be configured to buffer a synchronous reference signal and output a synchronous reference buffering signal. The synchronizing circuit may be configured to generate a synchronous signal based on the delay signal and the synchronous reference buffering signal.

In an embodiment, a synchronous circuit may include a buffer, a delay control circuit and a delay circuit. The buffer may be configured to buffer an input signal and output a buffering signal. The delay control circuit may be configured to generate a delay code based on a control code. The delay circuit may be configured to determine a delay time based on the delay code. The delay circuit may be configured to delay and output the buffering signal at the determined delay time. The buffer may be configured to control a transition slope of the buffering signal based on the control code. An output time of the input signal as the delay signal through the buffer and the delay circuit may be constant.

In an embodiment, a synchronous circuit may be provided. The synchronous circuit may include a first buffer configured to receive an input signal and control the transition timing of an output signal based on a control code. The synchronous circuit may include a delay circuit configured to control a delay time based on the control code to constantly maintain a time that the input signal received by the first buffer arrives at a synchronizing circuit.

DETAILED DESCRIPTION

Hereinafter, examples of embodiments will be described below with reference to the accompanying drawings through various examples of embodiments.

Figure 1:
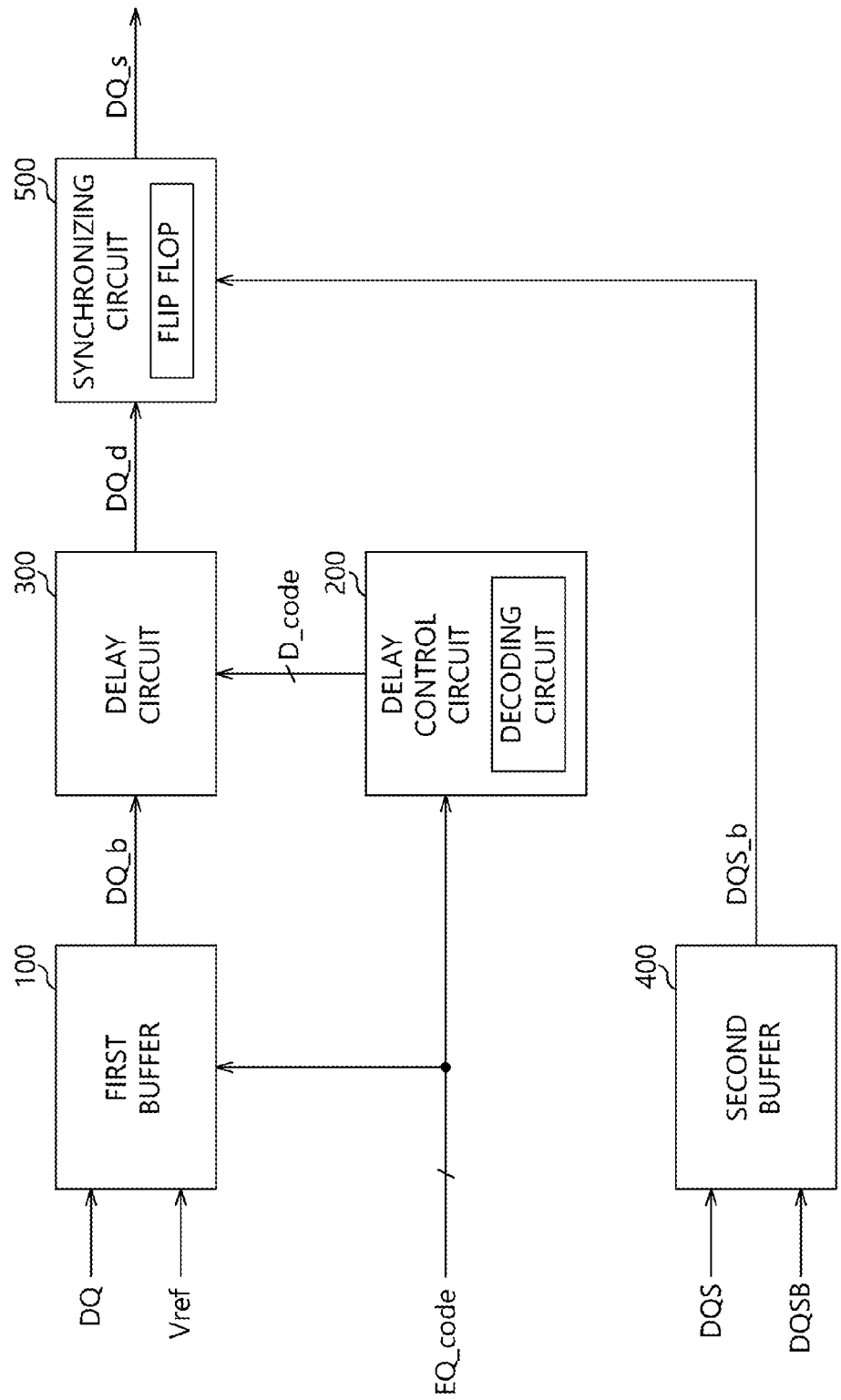
FIG. 1 is a circuit diagram illustrating a synchronous circuit in accordance with examples of embodiments.

FIG. 1 is a circuit diagram illustrating a synchronous circuit in accordance with examples of embodiments.

Referring to FIG. 1, a synchronous circuit of an example of an embodiment may include a first buffer 100, a delay control circuit 200, a delay circuit 300, a second buffer 400, and a synchronizing circuit 500.

The first buffer 100 may be configured to generate a buffering signal DQ_b in response to an input signal DQ, a reference voltage Vref and a control code EQ_code. For example, the first buffer 100 may buffer the input signal DQ based on a voltage level of the reference voltage Vref to generate the buffering signal DQ_b. Further, the first buffer 100 may control a transition timing of the buffering signal DQ_b in response to the control code EQ_code. Particularly, the first buffer 100 may generate the buffering signal DQ_b based on the voltage level of the reference voltage Vref. The first buffer 100 may advance or delay the transition timing of the buffering signal DQ_b in response to the control code EQ_code. The input signal DQ may include data. Advancing or delaying the transition timing of the buffering signal DQ_b may correspond to increase or decrease an edge slope of the buffering signal DQ_b. Further, the control code EQ_code may be outputted from an external device such as a controller. Alternatively, the control code EQ_code may be outputted from an internal circuit configured to store a code value of the control code EQ_code.

The delay control circuit 200 may be configured to generate a delay code D_code in response to the control code EQ_code. For example, the delay control circuit 200 may generate the delay code D_code for controlling a delay time of the buffering signal DQ_b in response to the control code EQ_code. That is, the delay control circuit 200 may generate the delay code D_code for controlling the delay time of the delay circuit 300 in response to the control code EQ_code. The delay control circuit 200 may include a decoding circuit. The first buffer 100 and the delay control circuit 200 may be configured to receive the same code EQ_code.

The delay circuit 300 may be configured to generate a delay signal DQ_d in response to the buffering signal DQ_b and the delay code D_code. For example, the delay circuit 300 may determine the delay time in response to the delay code D_code. The delay circuit 300 may delay the buffering signal DQ_b at a determined delay time to output the delay signal DQ_d.

The second buffer 400 may buffer a synchronous reference signal DQS to generate a synchronous reference buffering signal DQS_b. The synchronous reference signal DQS may include a data strobe signal. The synchronous reference signal DQS may include a synchronous reference bar signal DQSB having opposite phase as a differential signal.

The synchronizing circuit 500 may be configured to generate a synchronous signal DQ_s in response to the synchronous reference buffering signal DQS_b and the delay signal DQ_d. For example, the synchronizing circuit 500 may output the delay signal DQ_d as the synchronous signal DQ_s when the synchronous reference buffering signal DQS_b is transited to a specific level. Particularly, the synchronizing circuit 500 may output a voltage level of the delay signal DQ_d at a rising edge or a falling edge of the synchronous reference buffering signal DQS_b as a voltage level of the synchronous signal DQ_s. The synchronizing circuit 500 may include a Flip Flop.

The first buffer 100 may represent an output signal, i.e., a buffer for controlling a transition timing or a transition slope of the buffering signal DQ_b in response to the control code EQ_code.

Figure 2:
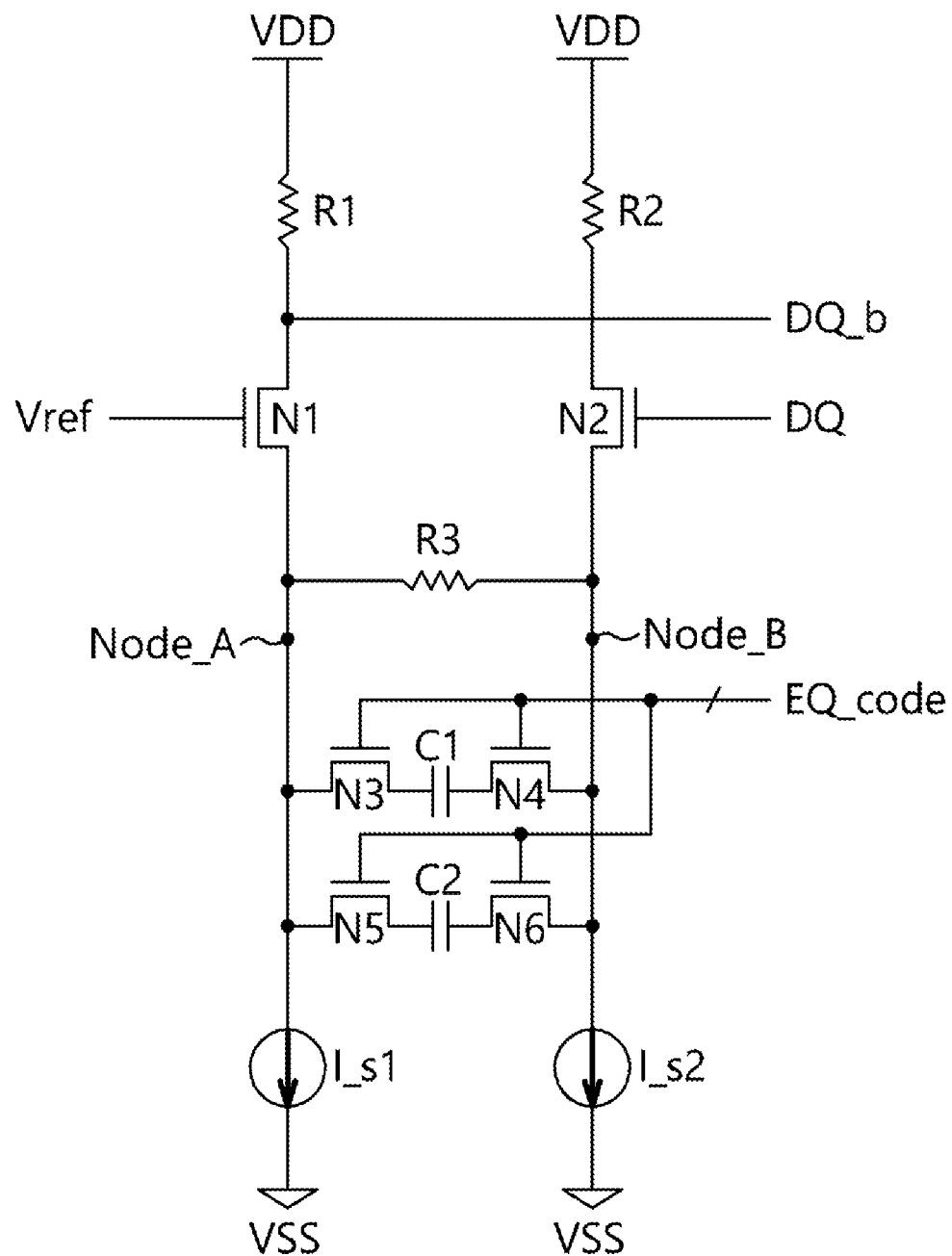
FIG. 2 is a circuit diagram illustrating a first buffer in FIG. 1.

FIG. 2 is a circuit diagram illustrating a first buffer in FIG. 1.

Referring to FIG. 2, the first buffer 100 may include first to third resistors R1, R2 and R3, first to sixth transistors N1, N2, N3, N4, N5 and N6, first and second capacitors C1 and C2, and first and second current sources I_s1 and I_s2. An external voltage VDD may be applied to one end of the first resistor R1. The external voltage VDD may be applied to one of the second resistor R2. The first transistor N1 may include a gate to which the reference voltage Vref may be applied, and a drain connected with the other end of the first resistor R1. In an embodiment, for example, the buffering signal DQ_b may be generated at a node located between a drain of the first transistor N1 and the other end of the first resistor R1. The second transistor N2 may include a gate into which the input signal DQ may be inputted, and a drain connected with the other end of the second resistor R2. The third resistor R3 may be connected with sources of the first and second transistors N1 and N2. A node connected with the third resistor R3 and the first transistor N1 may be a first node Node_A. A node connected with the third resistor R3 and the second transistor N2 may be a second node Node_B. The third transistor N3 may include a gate into which a bit of a signal in the control code EQ_code may be inputted, a drain connected with the first node Node_A, and a source connected with one end of the first capacitor C1. The fourth transistor N4 may include a gate into which a signal substantially the same as the signal inputted into the gate of the third transistor N3 may be inputted, a drain connected with the other end of the first capacitor C1, and a source connected with the second node Node_B. The fifth transistor N5 may include a gate into which a bit of the signal in the control code EQ_code may be inputted, a drain connected with the first node Node_A, and a source connected with one end of the second capacitor C2. The sixth transistor N6 may include a gate into which a signal substantially the same as the signal inputted into the gate of the fifth transistor N5 may be inputted, a drain connected with the other end of the second capacitor C2, and a source connected with the second node Node_B. The first current source I_s1 may be connected between the first node Node_A and a ground terminal VSS to constantly maintain an amount of a current flowing from the first node Node_A to the ground terminal VSS. The second current source I_s2 may be connected between the second node Node_B and the ground terminal VSS to constantly maintain an amount of a current flowing from the second node Node_B to the ground terminal VSS.

The first buffer 100 may have gains changed in response to the control code EQ_code. The first buffer 100 may control numbers of the capacitors connected between the first node Node_A and the second node Node_B by a code value of the control code EQ_code. The numbers of the capacitors may control the gains of the first buffer 100.

Figure 3:
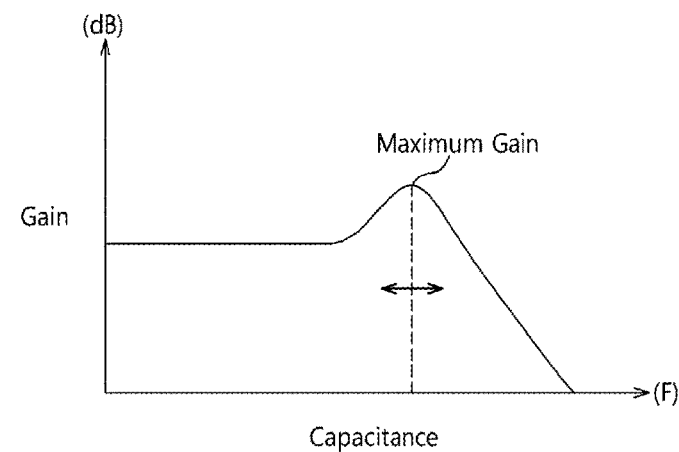
FIG. 3 is a graph showing characteristics of the first buffer in FIG. 2.
Figure 3:
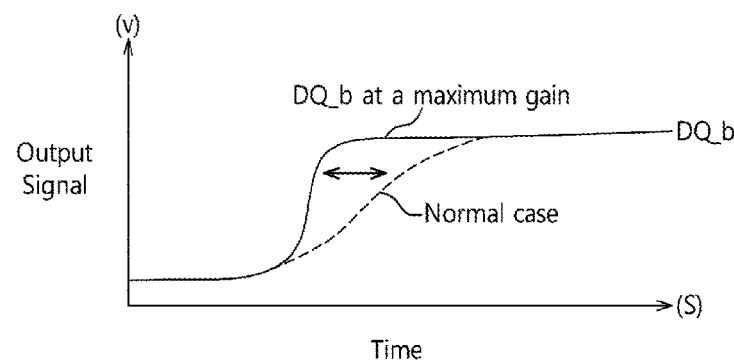

FIG. 3 is a graph showing characteristics of the first buffer in FIG. 2.

Referring to FIG. 3, different gains G of the first buffer 100 may be changed by the code value of the control code EQ_code. The top graph in FIG. 3 is a graph for illustrating the gain of the first buffer based on the number of capacitors connected between the first node Node_A and the second node Node_B as selected by a code value of the control code EQ_code. The 'Y-axis' of the top graph in FIG. 3 represents the gain in decibel (dB) units. The 'X-axis' of the top graph in FIG. 3 represents the different control codes EQ_code that may be inputted into the first buffer 100 to control the number of capacitors connected between the first node Node_A and the second node Node_B. Accordingly, the 'X-axis' may represent the capacitance of the first buffer 100, based on the number of capacitors selected, and the capacitance is in farad (F) units. In the top graph of FIG. 3 the dotted line that intersects with the solid line (i.e., the gain verses capacitance line) as shown is illustrating a maximum gain for the first buffer 100 at that selected capacitance. As indicated by the arrows if the selected capacitance is changed then the gain for the first buffer 100 will change as well. The bottom graph in FIG. 3 is a graph for illustrating the output signals of the first buffer 100 in units of voltage (v) verses time in units of seconds. The bottom graph in FIG. 3 illustrates the buffering signal DQ_b at a maximum gain (i.e, solid line) and the buffering signal DQ_b for a normal case (i.e. the dotted line) to show the different transition times for the different gains as influenced by the different capacitances selected by the control code EQ_code. For example, when the gain is at a maximum (i.e., maximum gain), the transition timing of the buffering signal DQ_b (i.e., buffering signal DQ_b at a maximum gain) corresponding to the output signal of the first buffer 100 may have the shortest timing from one voltage level to another. Further, the transition timing of the buffering signal DQ_b may increase in proportion to the gains being decreased. The first buffer 100 may change the gain of the output signal of the first buffer 100 in accordance with the code values of the control code EQ_code. The transition slope of the buffering signal DQ_b corresponding to the output signal of the first buffer 100 may be changed in accordance with the gain of the first buffer 100. Based on the transition slope, i.e., the transition timing of the buffering signal DQ_b are changed (as indicated by the arrows of the bottom graph of FIG. 3), an effective value of the buffering signal DQ_b may be rapidly or slowly inputted into other circuits. The effective value of the buffering signal DQ_B may be rapidly inputted into the other circuits in proportion to the shortening of the transition timing of the buffering signal DQ_b when compared to a normal case (i.e., normal case) where, for example, a transition timing of the buffering signal DQ_b is not controlled by the control code EQ_code. The effective value of the buffering signal DQ_B may be slowly inputted into the other circuits in proportion to the lengthening of the transition timing of the buffering signal DQ_b when compared to the normal case.

The delay circuit 300 may delay the buffering signal DQ_b outputted from the first buffer 100 using a delay time in response to the delay code D_code to output the delay signal DQ_d to the synchronizing circuit 500. The delay circuit 300 may include circuits for changing the delay time in response to the delay code D_code.

Figure 4:
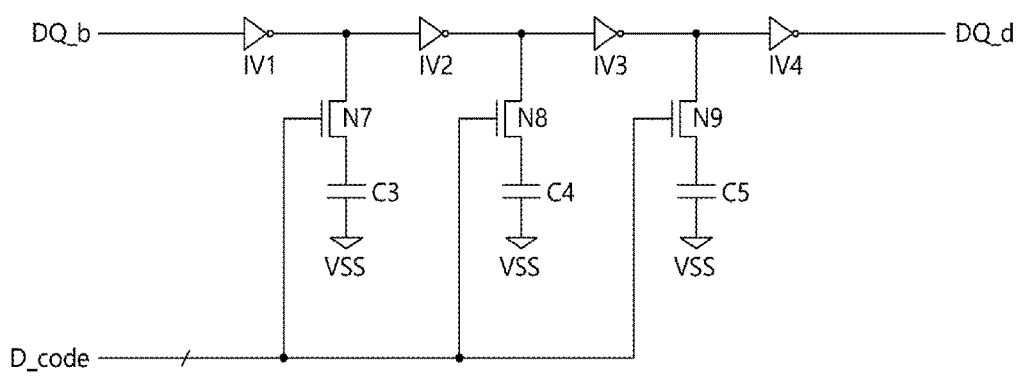
FIG. 4 is a circuit diagram illustrating a delay circuit in FIG. 1.

FIG. 4 is a circuit diagram illustrating a delay circuit in FIG. 1.

Referring to FIG. 4, the delay circuit 300 may include first to fourth inverters IV1, IV2, IV3 and IV4, third to fifth capacitors C3, C4 and C5, and seventh to ninth transistors N7, N8 and N9. The first to fourth inverters IV1, IV2, IV3 and IV4 may be serially connected with each other. The first inverter IV1 may be configured to receive the buffering signal DQ_b. The fourth inverter IV4 may be configured to output the delay signal DQ_d. The seventh transistor N7 may include a gate into which a first bit among the delay code D_code may be inputted, and a drain connected with a node, which may be connected with the first and second inverters IV1 and IV2. The third capacitor C3 may include one end connected with a source of the seventh transistor N7, and the other end connected with the ground terminal VSS. The eighth transistor N8 may include a gate into which a second bit among the delay code D_code may be inputted, and a drain connected with the second and third inverters IV2 and IV3. The fourth capacitor C4 may include one end connected with a source of the eighth transistor N8, and the other end connected with the ground terminal VSS. The ninth transistor N9 may include a gate into which a third bit among the delay code D_code may be inputted, and a drain connected with a node, which may be connected with third and fourth inverters IV3 and IV4. The fifth capacitor C5 may include one end connected with a source of the ninth transistor N9, and the other end connected with the ground terminal VSS.

The delay circuit 300 may determine the delay time in accordance with the numbers of the capacitors connected between the inverters among the capacitors in the delay circuit 300 in response to the delay code D_code.

Hereinafter, operations of the synchronous circuit in accordance with examples of embodiments are discussed below.

The semiconductor integrated circuit may receive a signal from a remote circuit or an adjacent circuit. As a speed of the semiconductor integrated circuit becomes more rapid, the high transition timing or the transition slope of the signal may result in rapidly transmitting and receiving the signal.

As mentioned above, as illustrated in FIG. 1, the synchronous circuit may include the first buffer 100, the delay control circuit 200, the delay circuit 300, the second buffer 400 and the synchronizing circuit 500.

The first buffer 100 may buffer the input signal DQ based on the voltage level of the reference voltage Vref to output the buffering signal DQ_b. The first buffer 100 may control the transition timing or the transition slope of the buffering signal DQ_b in response to the control code EQ_code. Particularly, as illustrated in FIG. 3, the gains of the first buffer 100 may be determined by the code value of the control code EQ_code. The transition timing of the buffering signal DQ_b may become more rapid in proportion to the increase in the gain. Further, the transition timing of the buffering signal DQ_b may become slower in proportion to the decrease in the gain of the first buffer 100 in accordance with the code value of the control code EQ_code.

The delay control circuit 200 may generate the delay code D_code in response to the control code EQ_code.

The delay circuit 300 may delay the buffering signal DQ_b using the delay time determined in response to the delay code D_code to output the delay signal DQ_d.

The second buffer 400 may buffer the synchronous reference signal DQS to output the synchronous reference buffering signal DQS_b.

The synchronizing circuit 500 may output the delay signal DQ_d as the synchronous signal DQ_s in response to the synchronous reference buffering signal DQS_b.

When the first buffer 100 provides the buffering signal DQ_b having the rapid transition timing or the rapid transition slope based on the control code EQ_code, the delay control circuit 200 may generate the delay code D_code for increasing the delay time of the delay circuit 300 in response to the control code EQ_code. In contrast, when the first buffer 100 may provide the buffering signal DQ_b with the slow transition timing or the slow transition slope by the control code EQ_code, the delay control circuit 200 may generate the delay code D_code for decreasing the delay time of the delay circuit 300 in response to the control code EQ_code.

Therefore, when the first buffer 100 may provide the buffering signal DQ_b with the rapid transition timing by the control code EQ_code, the delay time of the delay circuit 300 may be increased by the delay code D_code. In contrast, when the first buffer 100 may provide the buffering signal DQ_b with the slow transition timing by the control code EQ_code, the delay time of the delay circuit 300 may be decreased by the delay code D_code.

As a result, when the first buffer 100 may change the transition timing of the buffering signal DQ_b by the control code EQ_code, a time that the buffering signal DQ_b may arrive at the synchronizing circuit 500 may be changed by the delay control circuit 200 and the delay circuit 300.

That is, although the transition timing of the first buffer 100 may be changed by the control code EQ_code, the delay time of the delay circuit 300 may vary in response to the control code EQ_code to constantly maintain the time that the input signal of the first buffer 100 may arrive at the synchronizing circuit 500.

Thus, the signals inputted through the first buffer 100 and the second buffer 400 may be normally synchronized and outputted in the synchronizing circuit 500.

Figure 5:
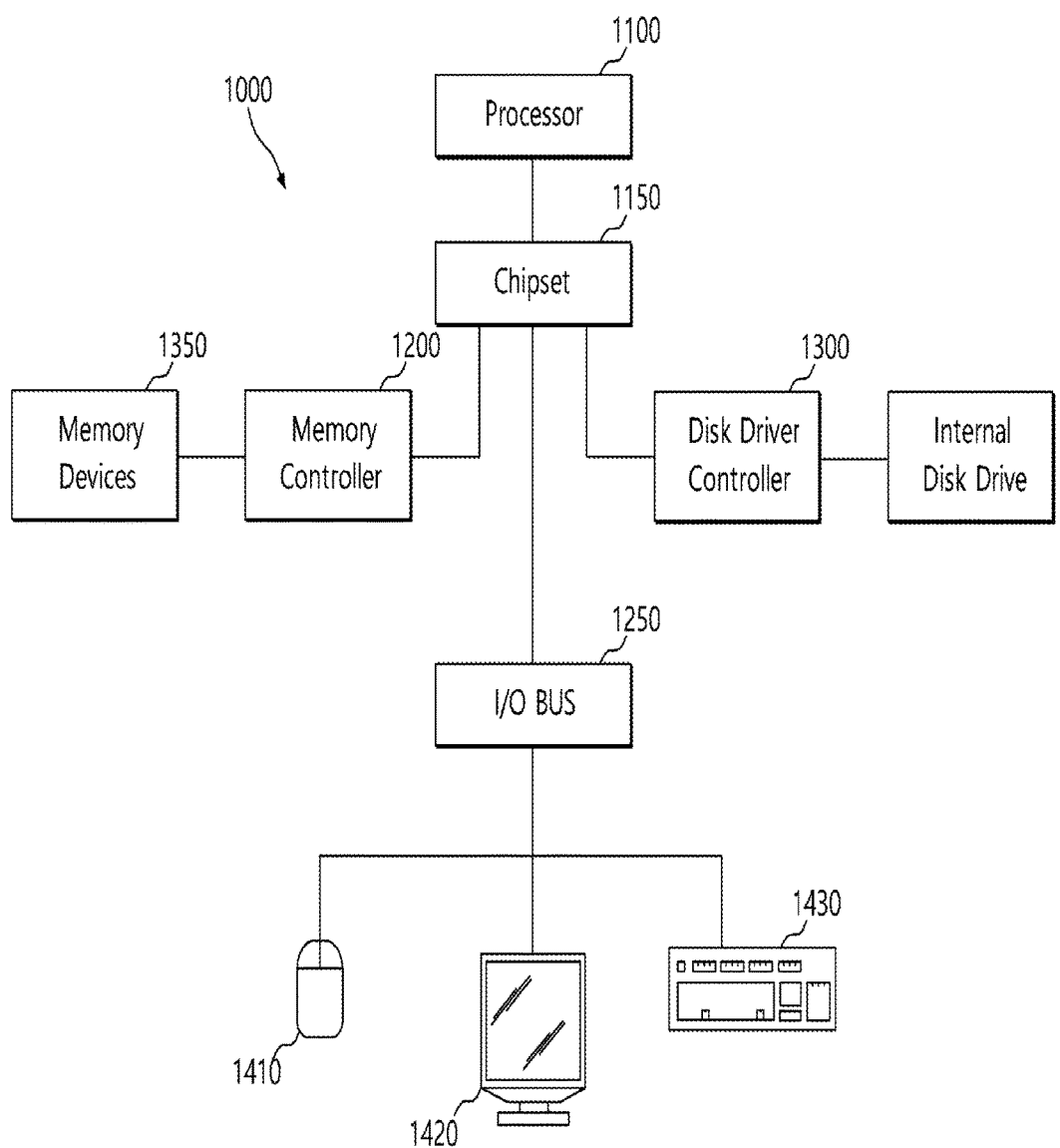
FIG. 5 illustrates a block diagram of an example of a representation of a system employing a synchronous circuit with the various embodiments discussed above with relation to FIGS. 1-4.

The synchronous circuits as discussed above (see FIGS. 1-4) are particular useful in the design of other memory devices, processors, and computer systems. For example, referring to FIG. 5, a block diagram of a system employing a synchronous circuit in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one synchronous circuit as discussed above with reference to FIGS. 1-4. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one synchronous circuit as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 5 is merely one example of a synchronous circuit as discussed above with relation to FIGS. 1-4. In alternate embodiments, such as, for example but not limited to, cellular phones or digital cameras, the components may differ from the embodiments illustrated in FIG. 5.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A synchronous circuit comprising:
   a first buffer configured to generate a buffering signal based on an input signal, a reference voltage, and a control code;
   a delay control circuit configured to generate a delay code based on the control code;
   a delay circuit configured to generate a delay signal based on the delay code and the buffering signal;
   a second buffer configured to buffer a synchronous reference signal to output a synchronous reference buffering signal; and
   a synchronizing circuit configured to generate a synchronous signal based on the delay signal and the synchronous reference buffering signal.

2. The synchronous circuit of claim 1, wherein the first buffer is configured to buffer the input signal based on a voltage level of the reference voltage, to generate the buffering signal, and to control a transition timing of the buffering signal based on the control code.

3. The synchronous circuit of claim 1, wherein the delay control circuit comprises a decoding circuit configured to decode the control code to generate the delay code.

4. The synchronous circuit of claim 1, wherein the delay circuit is configured to determine a delay time based on the delay code, to delay the buffering signal by the determined delay time, and to output the delayed buffering signal as the delay signal.

5. The synchronous circuit of claim 1, wherein the synchronizing circuit is configured to output the delay signal as the synchronous signal when the synchronous reference buffering signal is transited to a specific level.

6. The synchronous circuit of claim 5, wherein the synchronizing circuit comprises a Flip Flop.

7. The synchronous circuit of claim 1, wherein the input signal comprises data and the synchronous reference signal comprises a data strobe signal.

8. A synchronous circuit comprising:
   a first buffer configured to buffer an input signal to output a buffering signal;
   a delay control circuit configured to generate a delay code based on a control code; and
   a delay circuit configured to determine a delay time based on the delay code, to delay the buffering signal by the determined delay time, and to output the delayed buffering signal,
   wherein the first buffer is configured to control a transition slope of the buffering signal based on the control code, and an output time of the input signal as the delay signal through the buffer and the delay circuit is constant.

9. The synchronous circuit of claim 8, further comprising:
   a second buffer configured to buffer a synchronous reference signal to output a synchronous reference buffering signal; and
   a synchronizing circuit configured to synchronize the buffering signal with the synchronous reference buffering signal and to output the synchronized signal.

10. The synchronous circuit of claim 8, wherein the input signal comprises data and the synchronous reference signal is comprises a data strobe signal.

11. The synchronous circuit of claim 8, wherein the first buffer comprises a first node and a second node, and numbers of capacitors connected between the first node and the second node are changed based on the control code.

12. The synchronous circuit of claim 11, wherein the first node comprises a node connected with a first transistor including a gate, which receives a reference voltage, and a first current source, and the second node comprises a node connected with a second transistor including a gate, which receives the input signal, and a second current source.

13. The synchronous circuit of claim 12, wherein the first buffer comprises:
   a first resistor having one end to which an external voltage is applied;

a second resistor having one end to which the external voltage is applied;

the first transistor including the gate to which the reference voltage is applied and a drain connected with the other end of the first resistor;

the second transistor including the gate into which the input signal is inputted and a drain connected with the other end of the second resistor;

the first current source connected between a source of the first transistor and a ground terminal; and the second current source connected between a source of the second transistor and the ground terminal, wherein the numbers of the capacitors selectively connected between the first node, which is connected with the source of the first transistor and the first current source, and the second node, which is connected with the source of the second transistor and the second current source, based on the control code are controlled.

14. A synchronous circuit comprising:

a first buffer configured to receive an input signal and control the transition timing of an output signal based on a control code; and a delay circuit configured to control a delay time based on the control code to constantly maintain a time that the input signal received by the first buffer arrives at a synchronizing circuit.

15. The synchronous circuit of claim 14, wherein if the transition timing is increased then the delay time is increased.

16. The synchronous circuit of claim 14, wherein if the transition timing is decreased then the delay time is increased.

17. The synchronous circuit of claim 14, wherein the first buffer generates a buffering signal based on the input signal and the control code;

wherein the delay circuit controls the delay time of the buffering signal to generate a delay signal received by the synchronizing circuit.

18. The synchronous circuit of claim 14, wherein the first buffer is configured to change a gain of the output signal based on the control code received by the first buffer.

19. The synchronous circuit of claim 14, wherein the first buffer is configured to control a number of capacitors connected to the first buffer based on the control code to control a gain of the output signal.

20. The synchronous circuit of claim 14, further comprising:

a delay control circuit configured to generate a delay code based on the control code;

wherein the delay circuit is configured to control a number of capacitors connected to the delay circuit based on the delay code to control the delay time of the delay circuit.

* * * * *